(12) United States Patent
Yang et al.

(10) Patent No.: US 12,482,671 B2
(45) Date of Patent: Nov. 25, 2025

(54) GAS FLOW ACCELERATOR TO PREVENT BUILDUP OF PROCESSING BYPRODUCT IN A MAIN PUMPING LINE OF A SEMICONDUCTOR PROCESSING TOOL

(71) Applicant: Taiwan Semiconductor Manufacturing Company, Ltd., Hsinchu (TW)

(72) Inventors: Sheng-chun Yang, Tainan (TW); Chih-Lung Cheng, Tainan (TW); Yi-Ming Lin, Tainan (TW); Po-Chih Huang, Tainan (TW); Yu-Hsiang Juan, Taichung (TW); Xuan-Yang Zheng, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/623,347

(22) Filed: Apr. 1, 2024

(65) Prior Publication Data

US 2024/0258123 A1    Aug. 1, 2024

Related U.S. Application Data

(62) Division of application No. 16/947,422, filed on Jul. 31, 2020, now Pat. No. 11,972,957.

(51) Int. Cl.
*C23C 16/44* (2006.01)
*C23C 8/24* (2006.01)
(Continued)

(52) U.S. Cl.
CPC .......... *H01L 21/67017* (2013.01); *C23C 8/24* (2013.01); *C23C 14/50* (2013.01);
(Continued)

(58) Field of Classification Search
None
See application file for complete search history.

(56) References Cited

U.S. PATENT DOCUMENTS

| 3,559,895 A | 2/1971 | Fay et al. |
| 6,299,691 B1 | 10/2001 | Oda et al. |
| (Continued) | | |

FOREIGN PATENT DOCUMENTS

TW    201448110 A    12/2014

OTHER PUBLICATIONS

Taiwan Office Action issued in Application No. 110100665, dated Oct. 29, 2021, 4 Pages.

*Primary Examiner* — Binu Thomas
(74) *Attorney, Agent, or Firm* — Harrity & Harrity, LLP

(57) ABSTRACT

A gas flow accelerator may include a body portion, and a tapered body portion including a first end integrally formed with the body portion. The gas flow accelerator may include an inlet port connected to the body portion and to receive a process gas to be removed from a semiconductor processing tool by a main pumping line. The semiconductor processing tool may include a chuck and a chuck vacuum line to apply a vacuum to the chuck to retain a semiconductor device. The tapered body portion may be configured to generate a rotational flow of the process gas to prevent buildup of processing byproduct on interior walls of the main pumping line. The gas flow accelerator may include an outlet port integrally formed with a second end of the tapered body portion. An end portion of the chuck vacuum line may be provided through the outlet port.

20 Claims, 8 Drawing Sheets

(51) Int. Cl.
  *C23C 14/50*      (2006.01)
  *C23C 16/458*     (2006.01)
  *F15D 1/02*       (2006.01)
  *H01J 37/32*      (2006.01)
  *H01L 21/67*      (2006.01)
  *H01L 21/683*     (2006.01)

(52) U.S. Cl.
  CPC ...... *C23C 16/4401* (2013.01); *C23C 16/4412* (2013.01); *C23C 16/4583* (2013.01); *C23C 16/4586* (2013.01); *F15D 1/025* (2013.01); *H01J 37/32715* (2013.01); *H01J 37/32807* (2013.01); *H01J 37/32816* (2013.01); *H01J 37/32834* (2013.01); *H01L 21/6838* (2013.01)

(56) References Cited

U.S. PATENT DOCUMENTS

| | | | |
|---|---|---|---|
| 6,551,520 B1 | 4/2003 | Chu | |
| 2003/0141673 A1* | 7/2003 | Olgado | H01L 21/6838 269/21 |
| 2012/0111500 A1 | 5/2012 | Nagayama et al. | |
| 2013/0164147 A1* | 6/2013 | Graham | F04C 28/00 417/53 |
| 2019/0194806 A1 | 6/2019 | She et al. | |
| 2019/0326114 A1* | 10/2019 | Kachian | C23C 16/4586 |
| 2020/0105509 A1 | 4/2020 | Drewery et al. | |
| 2021/0079522 A1 | 3/2021 | Wu et al. | |
| 2022/0037169 A1 | 2/2022 | Yang et al. | |

\* cited by examiner

GAS FLOW ACCELERATOR TO PREVENT BUILDUP OF PROCESSING BYPRODUCT IN A MAIN PUMPING LINE OF A SEMICONDUCTOR PROCESSING TOOL

RELATED APPLICATION

This application is a divisional of U.S. patent application Ser. No. 16/947,422, filed Jul. 31, 2020, which is incorporated herein by reference in its entirety.

BACKGROUND

A semiconductor processing tool (e.g., a chemical vapor deposition (CVD) tool, a physical vapor deposition (PVD) tool, a rapid thermal anneal (RTA) tool, a decoupled plasma nitridation (DPN) tool, an atomic layer deposition (ALD) tool, an etching tool, and/or the like) includes a chamber in which a semiconductor device (e.g., a wafer) is processed using various types of processing gasses. The semiconductor device may be secured in place in the chamber by a chuck.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
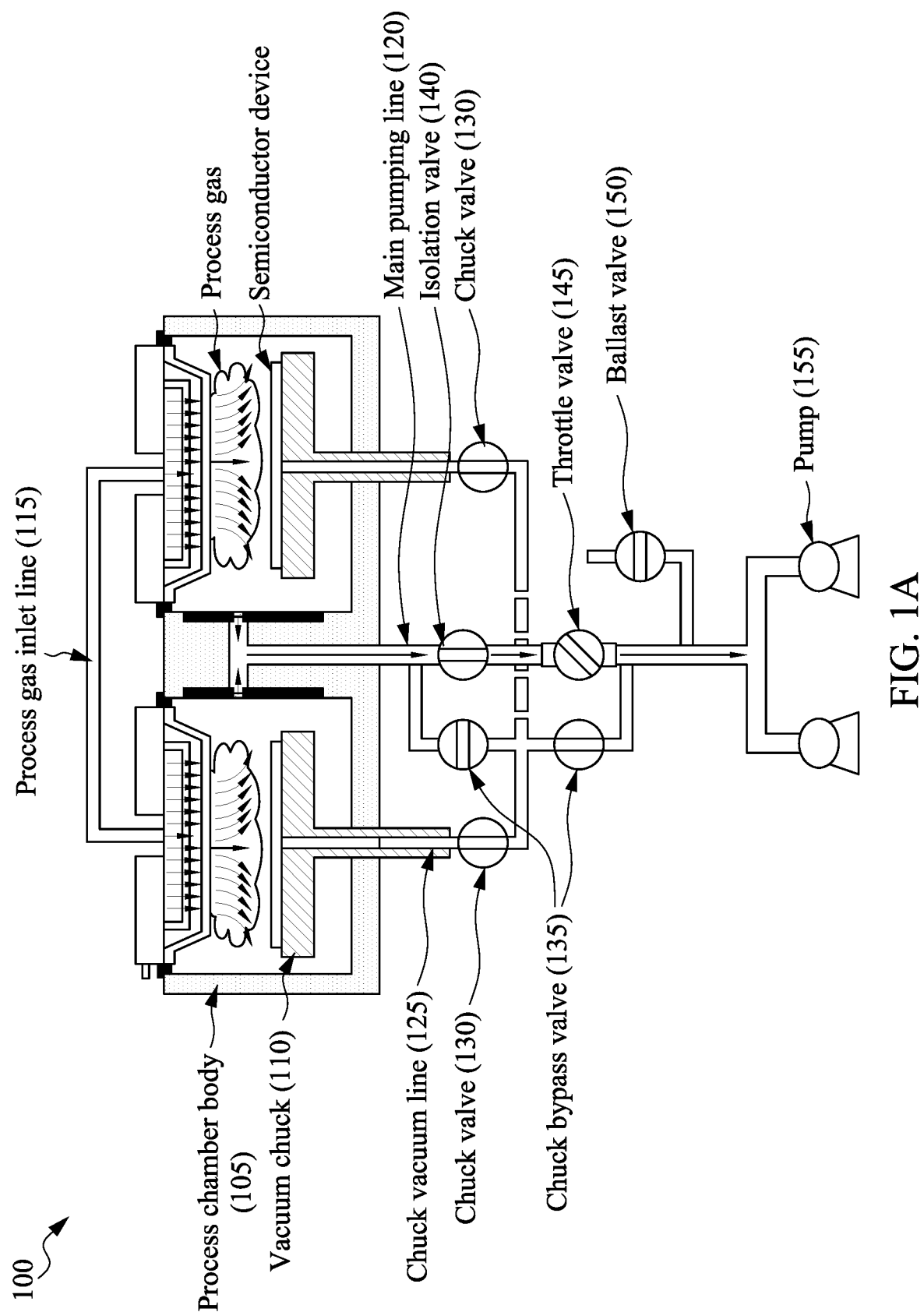
FIGS. 1A and 1B are diagrams of an example implementation of a semiconductor processing tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A vacuum chuck is a type of chuck that secures a semiconductor device through the use of a vacuum. The vacuum chuck may be connected to one or more plumbing fixtures (e.g., tubes, pipes, valves, and/or the like) through which air is sucked from the chamber and through one or more openings in the vacuum chuck to create an air pressure differential in the chamber. The air pressure differential includes a negative air pressure below the semiconductor device and a positive air pressure above the semiconductor device. The air pressure differential causes the semiconductor device to be forced against the vacuum chuck as the positive air pressure and the negative air pressure attempt to equalize in the chamber.

Through extended operation of the vacuum chuck, the plumbing fixtures may become increasingly lined with processing byproducts (e.g., polysilicon, silicon dioxide, and/or the like) that are pulled through the vacuum chuck. Buildup of these processing byproducts reduces and/or restricts airflow through the vacuum chuck and/or the plumbing fixtures, which decreases an effectiveness of the vacuum chuck to secure semiconductor devices in place. As a result, the semiconductor processing tool may need to be taken offline for maintenance to clean out the processing byproduct buildup, which decreases a productivity of the semiconductor processing tool.

According to some implementations described herein, a gas flow accelerator may prevent buildup of processing byproduct in a main pumping line of a semiconductor processing tool. For example, the gas flow accelerator may include a cylindrical body portion, and a tapered cylindrical body portion including a first end integrally formed with the cylindrical body portion. The gas flow accelerator may include an inlet port connected to the cylindrical body portion and to receive a process gas to be removed from a process chamber body of a semiconductor processing tool by a main pumping line. The semiconductor processing tool may include a chuck provided within the process chamber body and a chuck vacuum line connected to the chuck and to apply a vacuum to the chuck to retain a semiconductor device against the chuck. An end portion of the chuck vacuum line may be provided within the main pumping line, and an orientation of the end portion of the chuck vacuum line may be approximately parallel to an orientation of the main pumping line to prevent buildup of processing byproduct on interior walls of the main pumping line. The tapered cylindrical body portion may be configured to generate a rotational flow of the process gas to prevent buildup of processing byproduct on the interior walls of the main pumping line. The gas flow accelerator may include an outlet port integrally formed with a second end of the tapered cylindrical body portion, and a pressure relief port connected to the cylindrical body portion. An end portion of the chuck vacuum line may be provided through the pressure relief port and the outlet port.

In this way, one or more aspects of the gas flow accelerator and the parallel orientation of the main pumping line and the chuck vacuum line may prevent buildup of processing byproducts in the main pumping line of a semiconductor processing tool. The gas flow accelerator may generate a rotational flow of process gas within the accelerator, which prevents or reduces buildup of processing byproduct on the interior walls of the main pumping line. Moreover, the accelerator tapered cylindrical body portion may be tapered at an angle to increase a velocity of the process gas within the accelerator, which prevents or reduces buildup of processing byproduct on interior walls of the main pumping line. The parallel arrangement does not reduce the flow of the process gas in the flow direction through the main pumping line, which prevents buildup of processing byproducts on the interior walls of the main pumping line. This keeps the main pumping line and the chuck vacuum line from becoming clogged, which increases an effectiveness of the vacuum chuck at securing semiconductor devices in place during processing. Moreover, because the gas flow accelerator prevents and/or reduces buildup of processing byproducts, the semiconductor processing tool may be taken offline less frequently for maintenance of the main pumping line and/or the chuck vacuum line, which increases the productivity of the semiconductor processing tool.

Figure 1B:
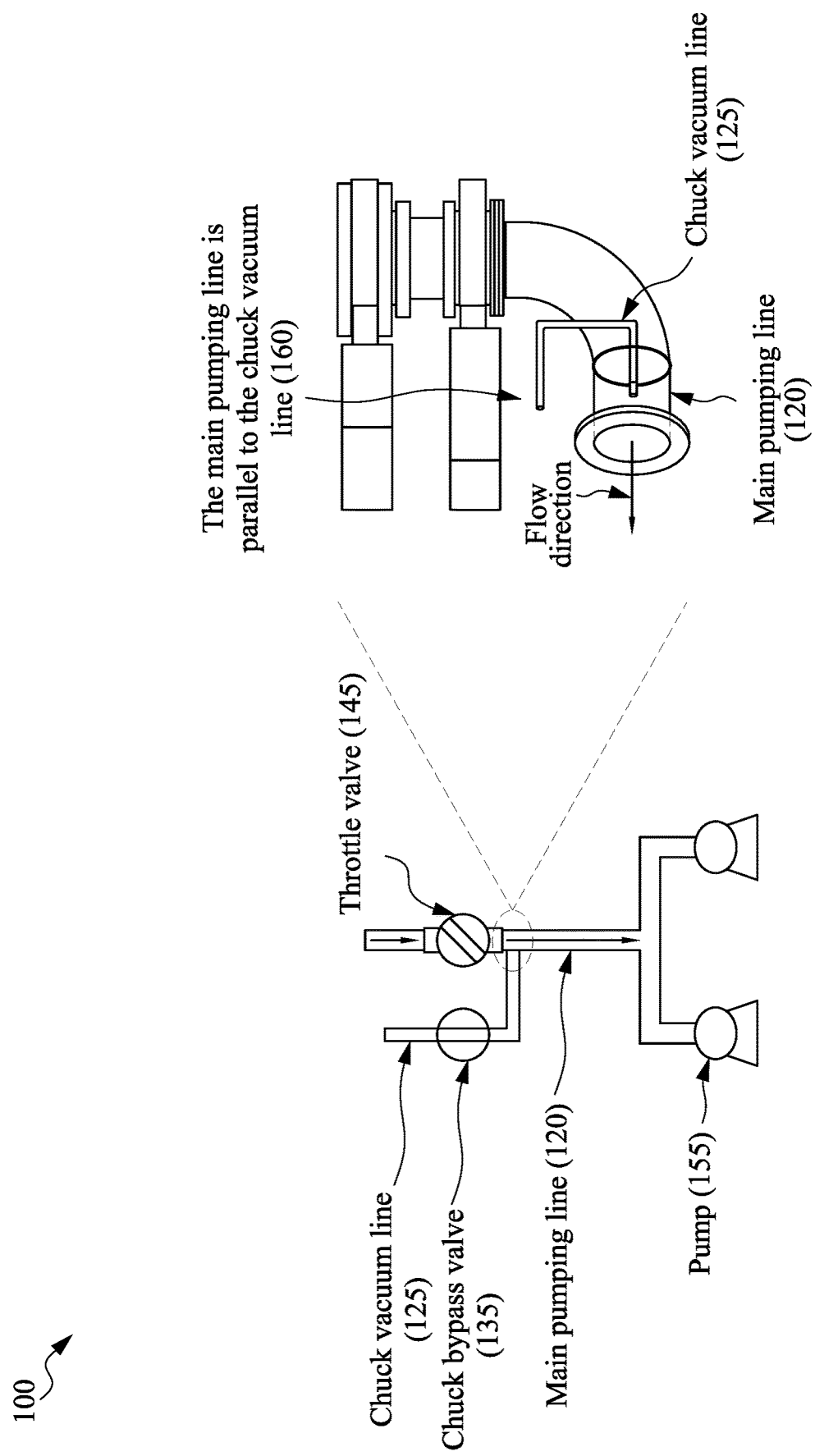

FIGS. 1A and 1B are diagrams 100 of a semiconductor processing tool described herein. The semiconductor processing tool may include a CVD tool, a PVD tool, an RTA tool, a DPN tool, an ALD tool, an etching tool, and/or the like. As shown in FIG. 1A, the semiconductor processing tool may include two process chamber bodies 105, two vacuum chucks 110, a process gas inlet line 115, a main pumping line 120, two chuck vacuum lines 125, two chuck valves 130, two chuck bypass valves 135, an isolation valve 140, a throttle valve 145, a ballast valve 150, and two pumps 155. The description to follow will describe an implementation of a semiconductor processing tool that includes two process chamber bodies 105, two vacuum chucks 110, a single process gas inlet line 115, a single main pumping line 120, two chuck vacuum lines 125, two chuck valves 130, two chuck bypass valves 135, a single isolation valve 140, a single throttle valve 145, a single ballast valve 150, and two pumps 155. In practice, a semiconductor processing tool may include additional or fewer process chamber bodies 105, vacuum chucks 110, process gas inlet lines 115, main pumping lines 120, chuck vacuum lines 125, chuck valves 130, chuck bypass valves 135, isolation valves 140, throttle valves 145, ballast valves 150, and/or pumps 155.

Process chamber body 105 may include a housing that defines a process chamber for processing a semiconductor device (e.g., a wafer) based on a function of the semiconductor processing tool. For example, the process chamber may be a CVD process chamber, a PVD process chamber, an RTA process chamber, a DPN process chamber, an ALD chamber, an etching process chamber, and/or the like. Process chamber body 105 may be maintained at a pressure while the semiconductor device is being processed. For example, a pressure within process chamber body 105 may be maintained at less than approximately one atmosphere when the semiconductor device is processed. Process chamber body 105 may be sized and shaped to house vacuum chuck 110, components associated with process gas inlet line 115, the semiconductor device, and/or the like. Process chamber body 105 may be cylindrical in shape to aid in processing the semiconductor device, but may be other shapes, such as box-shaped, spherical, and/or the like. In some implementations, process chamber body 105 is constructed of a material or materials that are resistant to abrasion and/or corrosion caused by process gases, semiconductor processes, pressures, temperatures, and/or the like associated with the semiconductor processing tool. For example, process chamber body 105 may be constructed of stainless steel, aluminum, and/or the like. In some implementations, process chamber body 105 includes walls with thicknesses that provide a rigid structure capable of withstanding the semiconductor processes, the pressures, the temperatures, and/or the like associated with the semiconductor processing tool.

Vacuum chuck 110 may be provided within process chamber body 105 and may be sized and shaped to support and secure the semiconductor device during processing by the semiconductor processing tool. For example, vacuum chuck 110 may be circular shaped and may support all or a portion of a circular-shaped semiconductor device. Vacuum chuck 110 may secure the semiconductor device through the use of a vacuum. Vacuum chuck 110 may be connected to one or more plumbing fixtures (e.g., chuck vacuum line 125) through which air is sucked from process chamber body 105 and through one or more openings in vacuum chuck 110 to create an air pressure differential in process chamber body 105. The air pressure differential includes a negative air pressure below the semiconductor device and a positive air pressure above the semiconductor device. The air pressure differential causes the semiconductor device to be forced against vacuum chuck 110 as the positive air pressure and the negative air pressure attempt to equalize in process chamber body 105. In some implementations, vacuum chuck 110 is constructed of a material or materials that are resistant to abrasion and/or corrosion caused by process gases, semiconductor processes, pressures, temperatures, and/or the like associated with the semiconductor processing tool. For example, vacuum chuck 110 may be constructed of stainless steel, aluminum, plated aluminum (e.g., gold plated or nickel plated), and/or the like. In some implementations, vacuum chuck 110 includes a surface friction that retains the semiconductor device on a surface of vacuum chuck 110.

Process gas inlet line 115 may include one or more plumbing fixtures (e.g., tubes, pipes, valves, and/or the like) through which a process gas is provided into process chamber body 105. The process gas may include a gas utilized to process the semiconductor device based on a function of the semiconductor processing tool. For example, the process gas may include silicon gas, argon, nitrogen, and/or the like. In some implementations, process gas inlet line 115 connects to both process chamber bodies 105 so that the process gas is delivered into process chamber bodies 105. Process gas inlet line 115 may couple with one or more mechanisms that evenly disperse the process gas into process chamber bodies 105 and onto the semiconductor device (e.g., as shown by the process gas clouds in FIG. 1A). Process gas inlet line 115 may be sized and shaped to provide a quantity of the process gas to process chamber bodies 105 so that the semiconductor processing tool may process the semiconductor device. In some implementations, process gas inlet line 115 is constructed of a material or materials that are resistant to corrosion or damage caused by the process gas, a pressure associated with the process gas, and/or the like. For example, process gas inlet line 115 may be constructed of polyvinyl chloride (PVC), chlorinated PVC (CPVC), polyvinylidene difluoride (PVDF), polypropylene, polyethylene, and/or the like.

Main pumping line 120 may include one or more plumbing fixtures (e.g., tubes, pipes, valves, and/or the like) through which the process gas is removed from process chamber bodies 105 after processing of the semiconductor device. Main pumping line 120 may connect to pump 155 and pump 155 may suck the process gas and processing byproducts from process chamber bodies 105 via main pumping line 120. Process gas inlet line 115 may be sized and shaped to provide a quantity of the process gas to process chamber bodies 105 so that the semiconductor processing tool may process the semiconductor device. In some implementations, main pumping line 120 is constructed of a material or materials that are resistant to corrosion or damage caused by the process gas, the pressure associated with the process gas, and/or the like. For example, main pumping line 120 may be constructed of PVC, CPVC, PVDF, polypropylene, polyethylene, and/or the like. Further details of main pumping line 120 are provided below in connection with FIGS. 1B and 2A.

Chuck vacuum line 125 may include one or more plumbing fixtures (e.g., tubes, pipes, valves, and/or the like) through which air is sucked from process chamber body 105 and through one or more openings in vacuum chuck 110 to create an air pressure differential in process chamber body 105. The air pressure differential includes a negative air pressure below the semiconductor device and a positive air pressure above the semiconductor device. The air pressure differential causes the semiconductor device to be forced against vacuum chuck 110 as the positive air pressure and the negative air pressure attempt to equalize in process chamber body 105. In some implementations, chuck vacuum line 125 connects to main pumping line 120, and the air is sucked through chuck vacuum line 125 via pump 155 sucking the process gas and processing byproducts from process chamber bodies 105 via main pumping line 120. In some implementations, chuck vacuum line 125 is constructed of a material or materials that are resistant to corrosion or damage caused by the process gas, the air pressure differential, and/or the like. For example, chuck vacuum line 125 may be constructed of PVC, CPVC, PVDF, polypropylene, polyethylene, and/or the like. Further details of chuck vacuum line 125 are provided below in connection with FIGS. 1B and 2A.

Chuck valve 130 may include a device that regulates, directs, or controls a flow of a fluid (e.g., a gas) by opening, closing, or partially obstructing various passageways. For example, chuck valve 130 may connect to chuck vacuum line 125 and may control a level of a vacuum (e.g., the negative air pressure below the semiconductor device) applied to vacuum chuck 110 by pump 155 via chuck vacuum line 125. In some implementations, chuck valve 130 is constructed of a material or materials that are resistant to corrosion or damage caused by the process gas, the air pressure differential, and/or the like. For example, one or more components of chuck valve 130 may be constructed of steel, aluminum, PVC, CPVC, PVDF, polypropylene, polyethylene, and/or the like.

Chuck bypass valve 135 may include a device that regulates, directs, or controls a flow of a fluid (e.g., a gas) by opening, closing, or partially obstructing various passageways. For example, chuck bypass valve 135 may connect to chuck vacuum line 125 and may control whether chuck vacuum line 125 connects to main pumping line 120 at a first location (e.g., upstream of isolation valve 140 and throttle valve 145) or a second location (e.g., downstream of throttle valve 145). In some implementations, chuck bypass valve 135 is constructed of a material or materials that are resistant to corrosion or damage caused by the process gas, the air pressure differential, and/or the like. For example, one or more components of chuck bypass valve 135 may be constructed of steel, aluminum, PVC, CPVC, PVDF, polypropylene, polyethylene, and/or the like.

Isolation valve 140 may include a device that regulates, directs, or controls a flow of a fluid (e.g., a gas) by opening, closing, or partially obstructing various passageways. For example, isolation valve 140 may connect to main pumping line 120 and may stop the flow of the process gas through main pumping line 120 (e.g., for maintenance purposes, safety purposes, and/or the like). In some implementations, isolation valve 140 is constructed of a material or materials that are resistant to corrosion or damage caused by the process gas, the air pressure differential, and/or the like. For example, one or more components of isolation valve 140 may be constructed of steel, aluminum, PVC, CPVC, PVDF, polypropylene, polyethylene, and/or the like.

Throttle valve 145 may include a device that regulates, directs, or controls a flow of a fluid (e.g., a gas) by opening, closing, or partially obstructing various passageways. For example, throttle valve 145 may connect to main pumping line 120 and may control a level of a vacuum applied to main pumping line 120 by pump 155. In some implementations, throttle valve 145 is constructed of a material or materials that are resistant to corrosion or damage caused by the process gas, the air pressure differential, and/or the like. For example, one or more components of throttle valve 145 may be constructed of steel, aluminum, PVC, CPVC, PVDF, polypropylene, polyethylene, and/or the like.

Ballast valve 150 may include a device that regulates, directs, or controls a flow of a fluid (e.g., a gas) by opening, closing, or partially obstructing various passageways. For example, ballast valve 150 may connect to main pumping line 120 and may prevent pump 155 from attaining a highest vacuum level achievable by pump 155. In some implementations, ballast valve 150 is constructed of a material or materials that are resistant to corrosion or damage caused by the process gas, the air pressure differential, and/or the like. For example, one or more components of ballast valve 150 may be constructed of steel, aluminum, PVC, CPVC, PVDF, polypropylene, polyethylene, and/or the like.

Pump 155 may include a device that removes a fluid (e.g., a gas) from a sealed volume in order to achieve a partial vacuum. For example, pump 155 may connect to main pumping line 120, and may remove the process gas, the processing byproduct, and/or the like from main pumping line 120. In some implementations, pump 155 is constructed of a material or materials that are resistant to corrosion or damage caused by the process gas, the air pressure differential, and/or the like. For example, one or more components of pump 155 may be constructed of steel, aluminum, PVC, CPVC, PVDF, polypropylene, polyethylene, and/or the like. In some implementations, the semiconductor processing tool may include a controller (not shown) that controls (e.g., opens, closes, partially opens, partially closes, and/or the like) chuck valves 130, chuck bypass valves 135, isolation valves 140, throttle valves 145, and/or ballast valves 150, and that controls (e.g., turns on or off) pumps 155.

In some implementations, as shown to the left in FIG. 1B, chuck vacuum line 125 may connect to main pumping line 120 downstream from throttle valve 145. Alternatively, or additionally, chuck vacuum line 125 may connect to main pumping line 120 upstream of isolation valve 140 and throttle valve 145. As shown to the right in FIG. 1B, a portion of chuck vacuum line 125 may be provided within main pumping line 120. As indicated by reference number 160, an orientation of a portion of main pumping line 120 (e.g., the portion of main pumping line 120 where chuck vacuum line 125 is provided) may be substantially parallel to an orientation of a portion of chuck vacuum line 125 (e.g., the portion where air exits chuck vacuum line 125). As further shown in FIG. 1B, the orientation of the portion of main pumping line 120 and the orientation of the portion of chuck vacuum line 125 may be parallel to a flow direction (e.g., right to left in FIG. 1B) of the process gas through main pumping line 120.

Prior arrangements orient chuck vacuum line 125 at an angle of approximately ninety degrees to an orientation of main pumping line 120 and to the flow direction. These prior arrangements reduce the flow of the process gas in the flow direction through main pumping line 120 and cause processing byproducts from chuck vacuum line 125 to be deposited at an angle of approximately ninety degrees in main pumping line 120. This causes main pumping line 120 to be increasingly lined with the processing byproducts, which reduces and/or restricts airflow through main pumping line 120. Conversely, the parallel arrangement of the orientation of the portion of main pumping line 120 and the orientation of the portion of chuck vacuum line 125 does not reduce the flow of the process gas in the flow direction through main pumping line 120. Thus, the parallel arrangement prevents buildup of processing byproducts on interior walls of main pumping line 120.

As indicated above, FIGS. 1A and 1B are provided merely as one or more examples. Other examples may differ from what is described with regard to FIGS. 1A and 1B.

Figure 2A:
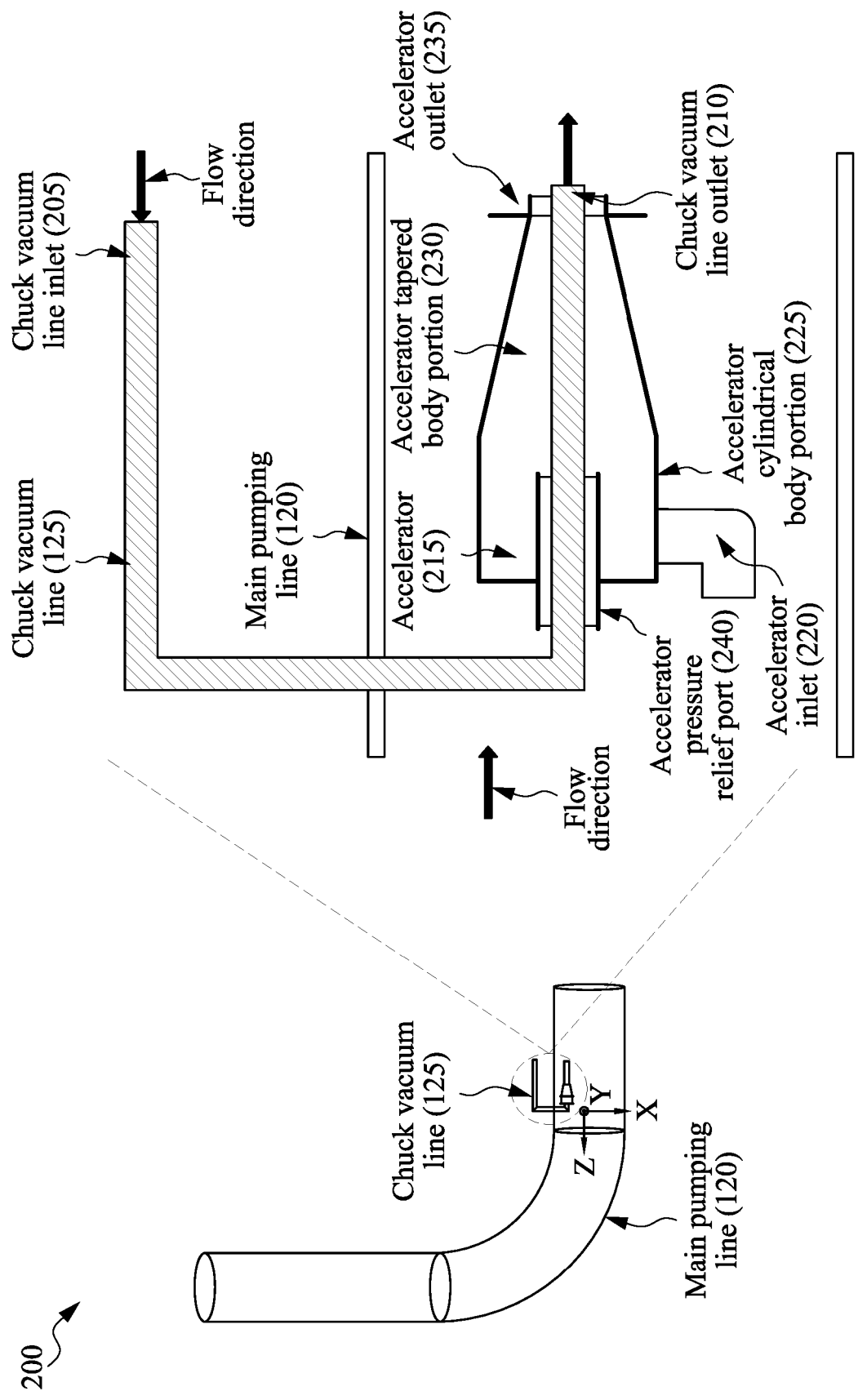
FIGS. 2A-2D are diagrams of an example implementation of a gas flow accelerator of the semiconductor processing tool.

FIGS. 2A-2D are diagrams 200 of an example implementation of a gas flow accelerator of the semiconductor processing tool. The right side of FIG. 2A provides an exploded view of an arrangement of chuck vacuum line 125 within main pumping line 120 (e.g., as shown to the left side of FIG. 2A). As shown, a first portion of chuck vacuum line 125 may be provided external to main pumping line 120 and a second portion of chuck vacuum line 125 may be provided internally within main pumping line 120. The first portion of chuck vacuum line 125 may include a chuck vacuum line inlet 205 that connects to and receives fluid (e.g., process gas, air, and/or the like) via the one or more openings provided in the vacuum chuck 110 (not shown). The second portion of chuck vacuum line 125 may include chuck vacuum line outlet 210 that provides the fluid from chuck vacuum line 125 to main pumping line 120. Thus, the fluid may flow from chuck vacuum line inlet 205 through chuck vacuum line 125, and may exit chuck vacuum line 125 through chuck vacuum line outlet 210 (e.g., as indicated by the flow direction arrows of FIG. 2A).

As further shown in FIG. 2A, a gas flow accelerator 215 (e.g., also referred to herein as an accelerator 215) may be provided within main pumping line 120 and around an end portion of chuck vacuum line 125. Accelerator 215 may include an accelerator inlet port 220, an accelerator cylindrical body portion 225, an accelerator tapered cylindrical body portion 230, an accelerator outlet port 235, and an accelerator pressure relief port 240. In some implementations, accelerator 215 is constructed of a material or materials that are resistant to corrosion or damage caused by the process gas, an internal pressure of main pumping line 120, and/or the like. For example, one or more components of accelerator 215 may be constructed of steel, aluminum, PVC, CPVC, PVDF, polypropylene, polyethylene, and/or the like. In some implementations, components of accelerator 215 are integrally formed via one of the materials described above.

Accelerator inlet port 220 may connect to accelerator cylindrical body portion 225 and may receive the process gas removed from process chamber body 105 of the semiconductor processing tool by main pumping line 120. Accelerator inlet port 220 may include an angled cylindrical tube (e.g., an elbow) with a first opening that oppositely faces the flow direction of the process gas provided through main pumping line 120. The angled cylindrical tube may include a second opening that communicates with an interior of accelerator cylindrical body portion 225. The process gas from main pumping line 120 may be received by the first opening of the angled cylindrical tube and may be provided to the interior of accelerator cylindrical body portion 225 via the second opening. In some implementations, the cylindrical tube includes an angle of approximately ninety degrees. Accelerator inlet port 220 may be connected at an angle to accelerator cylindrical body portion 225 to generate a rotational flow of the process gas within accelerator 215, which prevents or reduces buildup of processing byproduct on interior walls of main pumping line 120.

Accelerator cylindrical body portion 225 may include an interior portion, a first end through which accelerator inlet port 220 and accelerator pressure relief port 240 are provided, and a second end integrally formed with accelerator tapered cylindrical body portion 230.

Accelerator tapered cylindrical body portion 230 may include an interior portion, a first end integrally formed with the second end of accelerator cylindrical body portion 225, and a second end integrally formed with accelerator outlet port 235. In some implementations, accelerator tapered cylindrical body portion 230 is tapered at an angle to generate a rotational flow of the process gas within accelerator 215, which prevents or reduces buildup of processing byproduct on interior walls of main pumping line 120. In some implementations, accelerator tapered cylindrical body portion 230 is tapered at an angle to increase a velocity of the process gas within accelerator 215, which prevents or reduces buildup of processing byproduct on interior walls of main pumping line 120.

Accelerator outlet port 235 may be integrally formed with the second end of accelerator tapered cylindrical body portion 230. In some implementations, chuck vacuum line outlet 210 is approximately adjacent to accelerator outlet port 235 to prevent processing byproduct from chuck vacuum line 125 from depositing on interior walls of main pumping line 120.

Accelerator pressure relief port 240 may connect to the first end of accelerator cylindrical body portion 225. As shown in FIG. 2A, the end portion of chuck vacuum line 125 may be provided through accelerator pressure relief port 240 and accelerator outlet port 235. Accelerator pressure relief port 240 may control or limit a pressure in accelerator 215 by enabling gas to exit accelerator 215 and reenter main pumping line 120. Limiting the pressure in accelerator 215 may prevent accelerator 215 from being damaged due to over pressure.

Figure 2B:
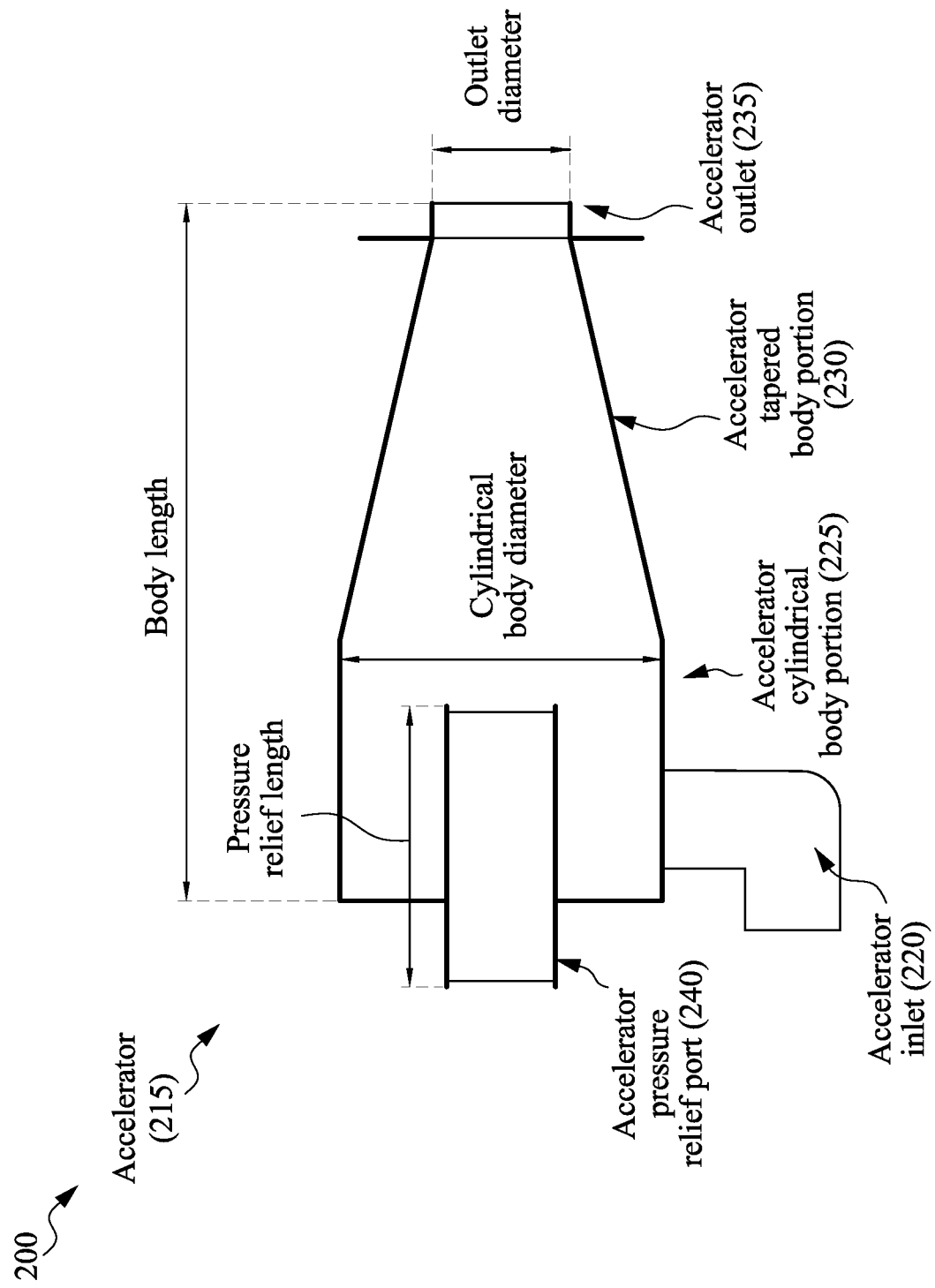

As shown in FIG. 2B, accelerator 215 may be sized and shaped with particular dimensions. The particular dimensions may be dependent upon a size of main pumping line 120, which may depend on a size of the semiconductor processing tool. Thus, the following dimensions are only example dimensions and, in practice, accelerator 215 may include different dimensions, greater dimensions, lesser dimensions, and/or the like. For example, a body length of accelerator cylindrical body portion 225 and accelerator tapered cylindrical body portion 230 may be greater than or equal to approximately one-hundred millimeters, such as one-hundred millimeters, one-hundred and ten millimeters, one-hundred and twenty millimeters, and/or the like; a diameter of accelerator cylindrical body portion 225 may be greater than or equal to approximately forty millimeters, such as forty millimeters, fifty millimeters, sixty millimeters, and/or the like; a diameter of accelerator outlet port 235 may be greater than or equal to approximately ten millimeters, such as ten millimeters, twenty millimeters, thirty millimeters, and/or the like; a length of pressure relief port 240 may be greater than or equal to approximately thirty-five millimeters, such as thirty-five millimeters, forty-five millimeters, fifty-five millimeters, and/or the like; and/or the like.

Figure 2C:
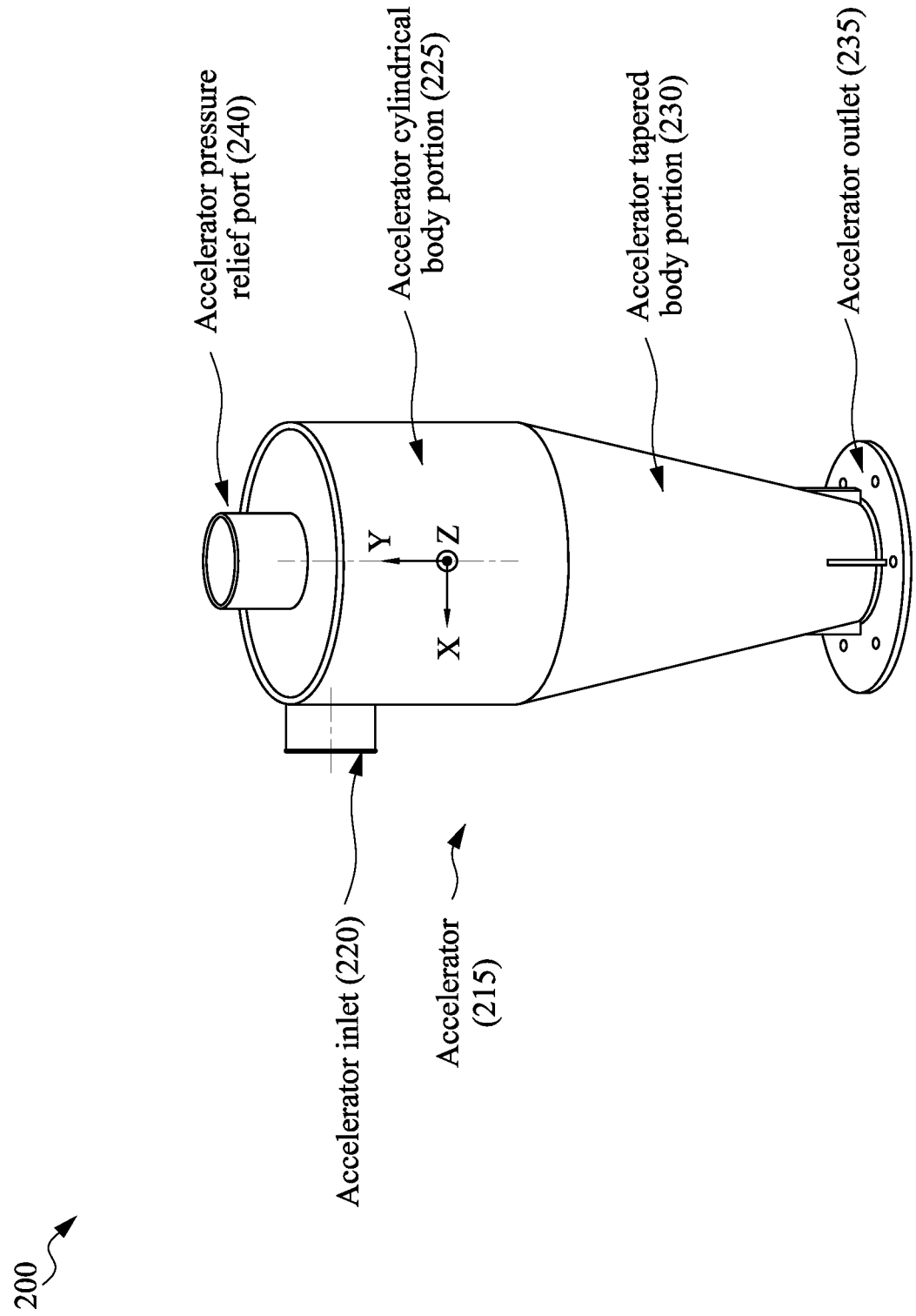
Figure 2D:
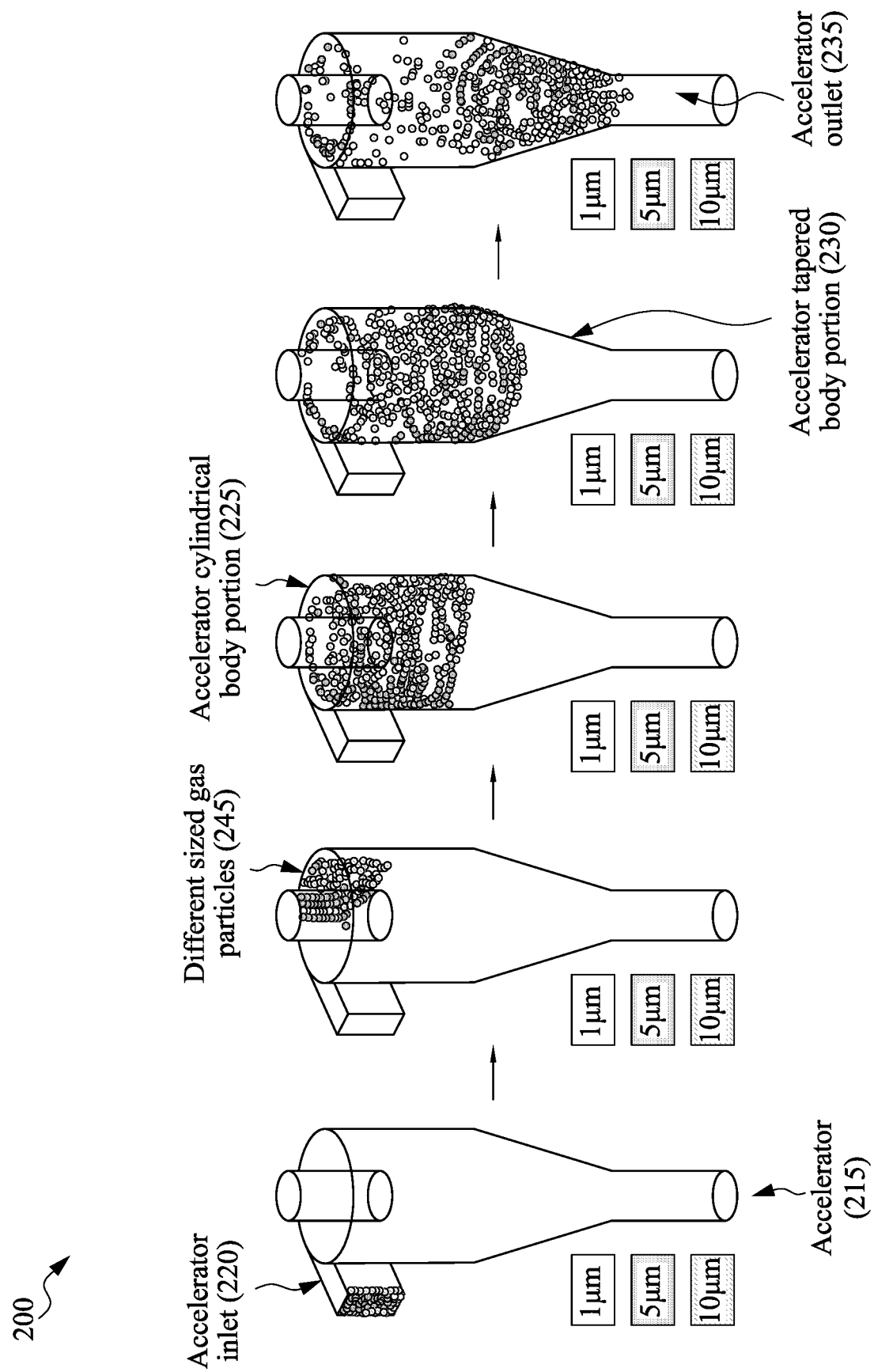

FIG. 2C provides a three-dimensional view of accelerator 215 depicted in FIGS. 2A and 2B. As shown, accelerator inlet port 220, accelerator cylindrical body portion 225, accelerator tapered cylindrical body portion 230, accelerator outlet port 235, and accelerator pressure relief port 240 may be integrally formed. Accelerator inlet port 220 may connect to a section of accelerator cylindrical body portion 225 that is away from a center section of accelerator cylindrical body portion 225. Such an arrangement may generate a rotational flow of the process gas within accelerator 215, as shown in FIG. 2D. Accelerator pressure relief port 240 may protrude from the first end of accelerator cylindrical body portion 225 and may be provided within the interior of accelerator cylindrical body portion 225, as shown in FIGS. 2A and 2B.

FIG. 2D provides three-dimensional views of the rotational flow of the process gas within accelerator 215. As shown by the first view (e.g., from left to right) of FIG. 2D, the process gas may enter accelerator 215 via accelerator inlet port 220, which connects to the section of accelerator cylindrical body portion 225 that is away from the center section of accelerator cylindrical body portion 225. As shown in the second view of FIG. 2D, and by reference number 245, the process gas may include different sized gas particles. For example, the process gas may include one micron sized gas particles, five micron sized gas particles, ten micron size gas particles, and/or the like. As shown in the third view of FIG. 2D, the gas particles may begin the rotational flow in accelerator cylindrical body portion 225. As shown in the fourth view of FIG. 2D, the rotational flow of the gas particles may continue in accelerator tapered cylindrical body portion 230, and the angle of accelerator tapered cylindrical body portion 230 may increase a velocity of the gas particles. As shown in the fifth view of FIG. 2D, the rotational flow and the velocity of the gas particles may increase as the gas particles pass through accelerator tapered cylindrical body portion 230 and exit accelerator 215 via accelerator outlet port 235. As described above, the rotational flow and the increased velocity (e.g., acceleration) of the gas particles in accelerator 215 prevent or reduce buildup of processing byproduct on interior walls of main pumping line 120.

As indicated above, FIGS. 2A-2D are provided merely as one or more examples. Other examples may differ from what is described with regard to FIGS. 2A-2D.

Figure 3:
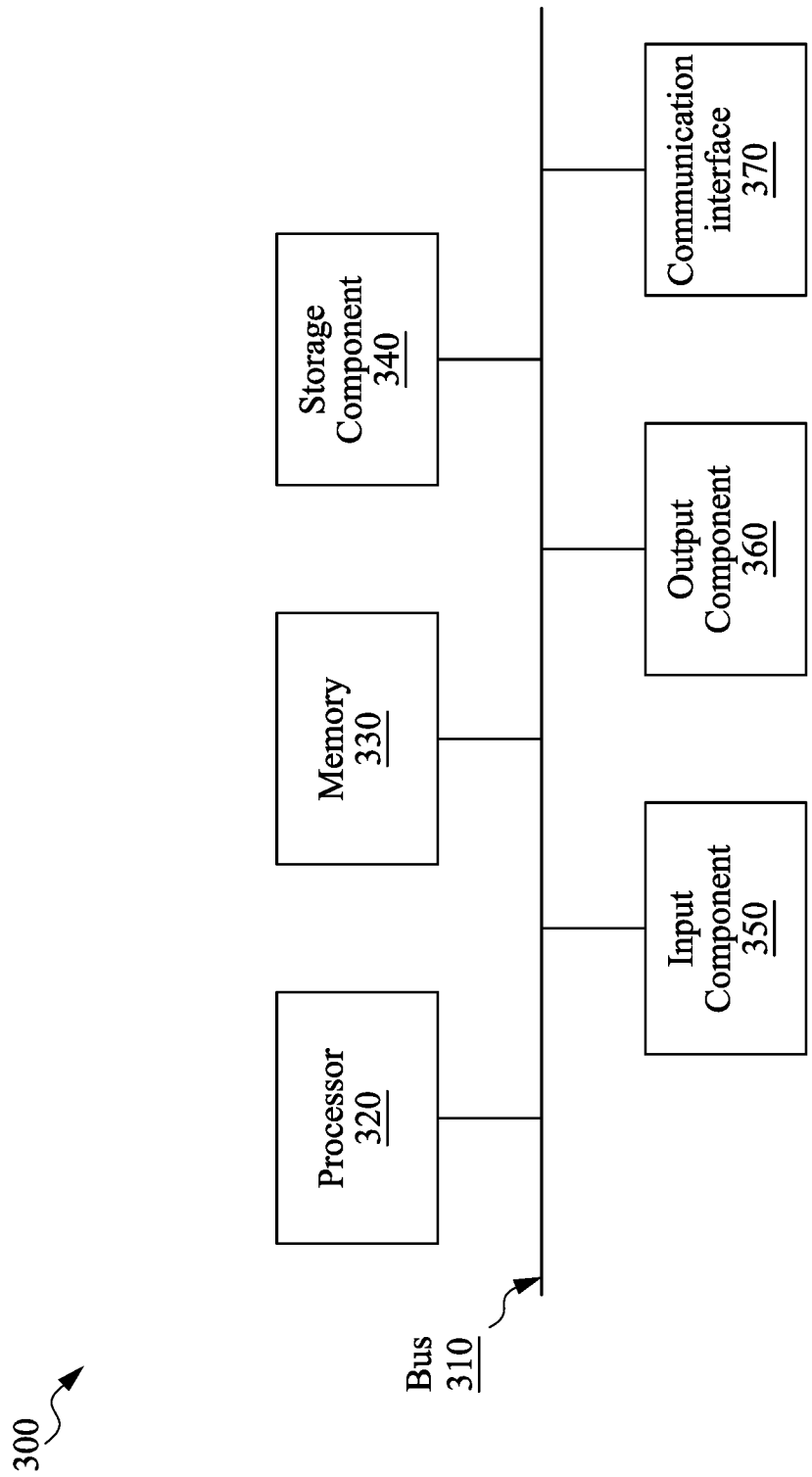
FIG. 3 is a diagram of example components of the semiconductor processing tool.

FIG. 3 is a diagram of example components of a device 300. Device 300 may correspond to the semiconductor processing tool. In some implementations, the semiconductor processing tool may include one or more devices 300 and/or one or more components of device 300. As shown in FIG. 3, device 300 may include a bus 310, a processor 320, a memory 330, a storage component 340, an input component 350, an output component 360, and a communication component 370.

Bus 310 includes a component that enables wired and/or wireless communication among the components of device 300. Processor 320 includes a central processing unit, a graphics processing unit, a microprocessor, a controller, a microcontroller, a digital signal processor, a field-programmable gate array, an application-specific integrated circuit, and/or another type of processing component. Processor 320 is implemented in hardware, firmware, or a combination of hardware and software. In some implementations, processor 320 includes one or more processors capable of being programmed to perform a function. Memory 330 includes a random access memory), a read only memory, and/or another type of memory (e.g., a flash memory, a magnetic memory, and/or an optical memory).

Storage component 340 stores information and/or software related to the operation of device 300. For example, storage component 340 may include a hard disk drive, a magnetic disk drive, an optical disk drive, a solid state disk drive, a compact disc, a digital versatile disc, and/or another type of non-transitory computer-readable medium. Input component 350 enables device 300 to receive input, such as user input and/or sensed inputs. For example, input component 350 may include a touch screen, a keyboard, a keypad, a mouse, a button, a microphone, a switch, a sensor, a global positioning system component, an accelerometer, a gyroscope, an actuator, and/or the like. Output component 360 enables device 300 to provide output, such as via a display, a speaker, and/or one or more light-emitting diodes. Communication component 370 enables device 300 to communicate with other devices, such as via a wired connection and/or a wireless connection. For example, communication component 370 may include a receiver, a transmitter, a transceiver, a modem, a network interface card, an antenna, and/or the like.

Device 300 may perform one or more processes described herein. For example, a non-transitory computer-readable medium (e.g., memory 330 and/or storage component 340) may store a set of instructions (e.g., one or more instructions, code, software code, program code, and/or the like) for execution by processor 320. Processor 320 may execute the set of instructions to perform one or more processes described herein. In some implementations, execution of the set of instructions, by one or more processors 320, causes the one or more processors 320 and/or the device 300 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 3 are provided as an example. Device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
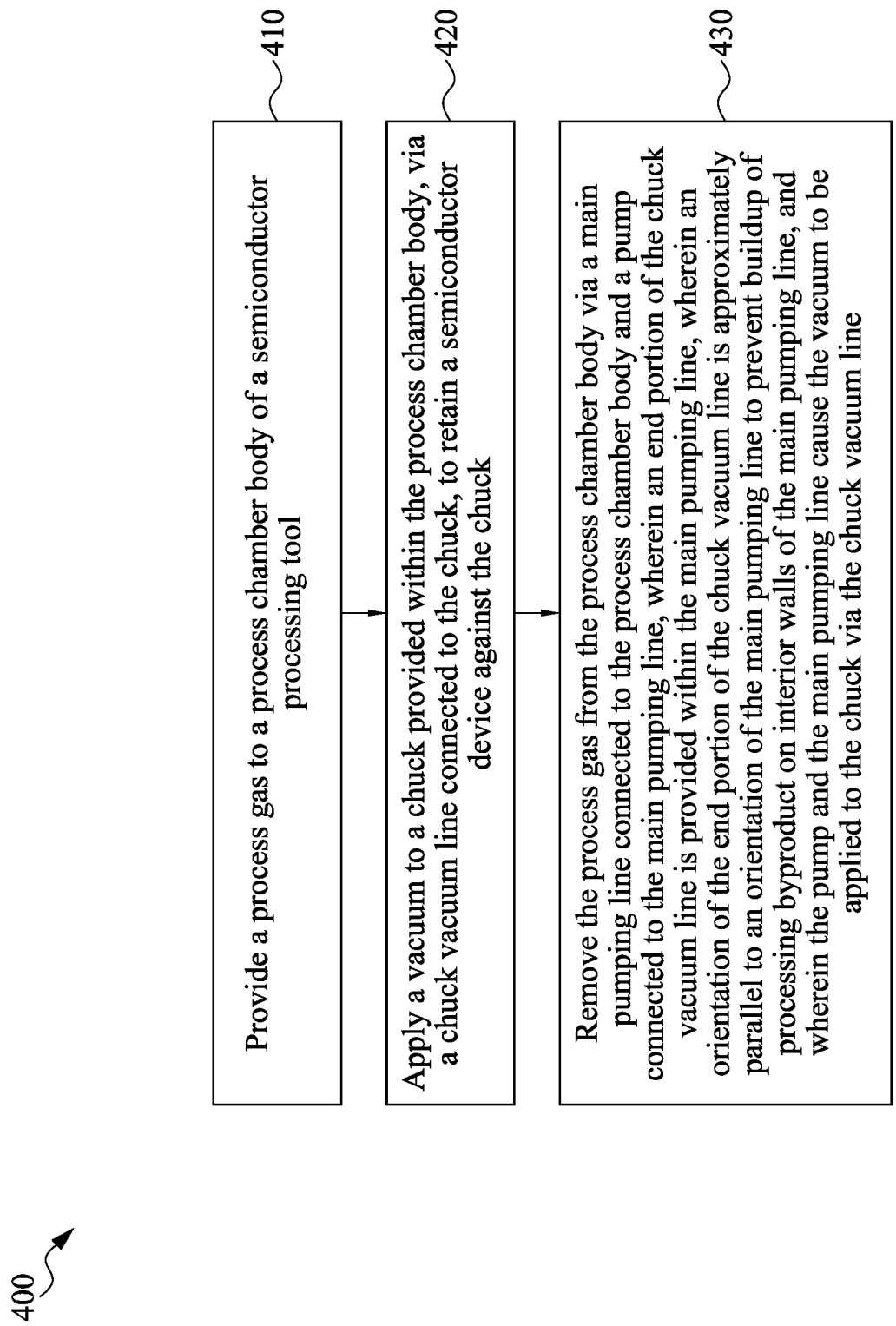
FIG. 4 is a flowchart of an example process for preventing buildup of processing byproduct in a main pumping line of the semiconductor processing tool.

FIG. 4 is a flow chart of an example process 400 for preventing buildup of processing byproduct in a main pumping line of a semiconductor processing tool. In some implementations, one or more process blocks of FIG. 4 may be performed by a semiconductor processing tool (e.g., the semiconductor processing tool of FIGS. 1A and 1B). In some implementations, one or more process blocks of FIG. 4 may be performed by another device or a group of devices separate from or including the semiconductor processing tool. Additionally, or alternatively, one or more process blocks of FIG. 4 may be performed by one or more components of device 300, such as processor 320, memory 330, storage component 340, input component 350, output component 360, communication component 370, and/or the like.

As shown in FIG. 4, process 400 may include providing a process gas to a process chamber body of a semiconductor processing tool (block 410). For example, process gas inlet line 115 of a semiconductor processing tool may provide a process gas to a process chamber body 105 of the semiconductor processing tool, as described above.

As further shown in FIG. 4, process 400 may include applying a vacuum to a chuck provided within the process chamber body, via a chuck vacuum line connected to the chuck, to retain a semiconductor device against the chuck (block 420). For example, the semiconductor processing tool may apply a vacuum to a vacuum chuck 110 provided within process chamber body 105, via a chuck vacuum line 125 connected to vacuum chuck 110, to retain a semiconductor device against vacuum chuck 110, as described above.

As further shown in FIG. 4, process 400 may include removing the process gas from the process chamber body via a main pumping line connected to the process chamber body and a pump connected to the main pumping line, wherein an end portion of the chuck vacuum line is provided within the main pumping line, wherein an orientation of the end portion of the chuck vacuum line is approximately parallel to an orientation of the main pumping line to prevent buildup of processing byproduct on interior walls of the main pumping line, and wherein the pump and the main pumping line cause the vacuum to be applied to the chuck via the chuck vacuum line (block 430). For example, the semiconductor processing tool may remove the process gas from process chamber body 105 via a main pumping line 120 connected to process chamber body 105 and a pump 155 connected to main pumping line 120, as described above. In some implementations, an end portion of chuck vacuum line 125 is provided within main pumping line 120. In some implementations, an orientation of the end portion of chuck vacuum line 125 is approximately parallel to an orientation of main pumping line 120 to prevent buildup of processing byproduct on interior walls of main pumping line 120. In some implementations, pump 155 and main pumping line 120 cause the vacuum to be applied to vacuum chuck 110 via chuck vacuum line 125.

Process 400 may include additional implementations, such as any single implementation or any combination of implementations described below and/or in connection with one or more other processes described elsewhere herein.

In a first implementation, the semiconductor processing tool includes a chemical vapor deposition tool, a physical vapor deposition tool, a rapid thermal annealing tool, a decoupled plasma nitridation tool, an atomic layer deposition tool, or an etching tool.

In a second implementation, alone or in combination with the first implementation, process 400 includes increasing a velocity of the process gas, via a gas flow accelerator 215 provided within main pumping line 120 and around an end portion of chuck vacuum line 125, to prevent buildup of processing byproduct on interior walls of main pumping line 120.

In a third implementation, alone or in combination with one or more of the first and second implementations, process 400 includes generating a rotational flow of the process gas, via gas flow accelerator 215, to further prevent the buildup of the processing byproduct on the interior walls of main pumping line 120.

In a fourth implementation, alone or in combination with one or more of the first through third implementations, process 400 includes maintaining a pressure within process chamber body 105 at less than approximately one atmosphere when the semiconductor device is processed.

In a fifth implementation, alone or in combination with one or more of the first through fourth implementations, process 400 includes controlling, via a chuck valve 130 connected to chuck vacuum line 125, a level of the vacuum applied to vacuum chuck 110 by pump 155 via chuck vacuum line 125.

In a sixth implementation, alone or in combination with one or more of the first through fifth implementations, gas flow accelerator 215 includes a cylindrical body portion 225; a tapered cylindrical body portion 230 including a first end integrally formed with cylindrical body portion 225; an inlet port 220 connected to cylindrical body portion 225 and to receive the process gas from main pumping line 120; an outlet port 235 integrally formed with a second end of the tapered cylindrical body portion 230; and a pressure relief port 240 connected to cylindrical body portion 225, wherein the end portion of chuck vacuum line 125 is provided through pressure relief port 240 and outlet port 235.

In a seventh implementation, alone or in combination with one or more of the first through sixth implementations, inlet port 220 is connected at an angle to cylindrical body portion 225 to generate a rotational flow of the process gas within gas flow accelerator 215.

In an eighth implementation, alone or in combination with one or more of the first through seventh implementations, tapered cylindrical body portion 230 is tapered at an angle to increase a velocity of the process gas within gas flow accelerator 215.

In a ninth implementation, alone or in combination with one or more of the first through eighth implementations, an outlet 210 of chuck vacuum line 125 is approximately adjacent to outlet port 235 of gas flow accelerator 215 to prevent processing byproduct from chuck vacuum line 125 from depositing on interior walls of main pumping line 120.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

In this way, one or more aspects of a gas flow accelerator 215 and the parallel orientation of main pumping line 120 and chuck vacuum line 125 may prevent buildup of processing byproducts in main pumping line 120 of semiconductor processing tool. The gas flow accelerator 215 may generate a rotational flow of process gas within accelerator 215, which prevents or reduces buildup of processing byproduct on interior walls of main pumping line 120. Moreover, the accelerator tapered cylindrical body portion 230 may be tapered at an angle to increase a velocity of the process gas within accelerator 215, which prevents or reduces buildup of processing byproduct on interior walls of main pumping line 120. The parallel arrangement does not reduce the flow of the process gas in the flow direction through main pumping line 120, which prevents buildup of processing byproducts on interior walls of main pumping line 120. This keeps main pumping line 120 and chuck vacuum line 125 (e.g., which create a vacuum for vacuum chuck 110) from becoming clogged, which increases an effectiveness of vacuum chuck 110 at securing semiconductor devices in place during processing. Moreover, because gas flow accelerator 215 prevents and/or reduces buildup of processing byproducts, the semiconductor processing tool may be taken offline less frequently for maintenance of main pumping line 120 and/or chuck vacuum line 125, which increases the productivity of the semiconductor processing tool.

As described in greater detail above, some implementations described herein provide a semiconductor processing tool. The semiconductor processing tool may include a process chamber body, and a gas inlet line connected to the process chamber body and to provide a process gas to the process chamber body. The semiconductor processing tool may include a chuck provided within the process chamber body and to support a semiconductor device to be processed by the semiconductor processing tool, and a chuck vacuum line connected to the chuck and to apply a vacuum to the chuck to retain the semiconductor device against the chuck. The semiconductor processing tool may include a main pumping line connected to the process chamber body and to remove the process gas from the process chamber body after the semiconductor device is processed. An end portion of the chuck vacuum line may be provided within the main pumping line, and an orientation of the end portion of the chuck vacuum line may be approximately parallel to an orientation of the main pumping line to prevent buildup of processing byproduct on interior walls of the main pumping line. The semiconductor processing tool may include a gas flow accelerator provided within the main pumping line and around the end portion of the chuck vacuum line, and a pump connected to the main pumping line, to cause the process gas to be removed from the process chamber body through the main pumping line, and to cause the vacuum to be applied to the chuck via the chuck vacuum line.

As described in greater detail above, some implementations described herein provide a gas flow accelerator. The gas flow accelerator may include a cylindrical body portion, and a tapered cylindrical body portion including a first end integrally formed with the cylindrical body portion. The gas flow accelerator may include an inlet port connected to the cylindrical body portion and to receive a process gas to be removed from a process chamber body of a semiconductor processing tool by a main pumping line. The semiconductor processing tool may include a chuck provided within the process chamber body and a chuck vacuum line connected to the chuck and to apply a vacuum to the chuck to retain a semiconductor device against the chuck. The tapered cylindrical body portion may be configured to generate a rotational flow of the process gas to prevent buildup of processing byproduct on interior walls of the main pumping line. The gas flow accelerator may include an outlet port integrally formed with a second end of the tapered cylindrical body portion, and a pressure relief port connected to the cylindrical body portion. An end portion of the chuck vacuum line may be provided through the pressure relief port and the outlet port.

As described in greater detail above, some implementations described herein provide a method for processing a semiconductor device. The method may include providing a process gas to a process chamber body of a semiconductor processing tool, and applying a vacuum to a chuck provided within the process chamber body, via a chuck vacuum line connected to the chuck, to retain a semiconductor device against the chuck. The method may include removing the process gas from the process chamber body via a main pumping line connected to the process chamber body and a pump connected to the main pumping line. An end portion of the chuck vacuum line may be provided within the main pumping line, and an orientation of the end portion of the chuck vacuum line may be approximately parallel to an orientation of the main pumping line to prevent buildup of processing byproduct on interior walls of the main pumping line. The pump and the main pumping line may cause the vacuum to be applied to the chuck via the chuck vacuum line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that those skilled in the art may make various changes, substitutions, and alterations herein without departing from the spirit and scope of the present disclosure.

What is claimed is:

1. A gas flow accelerator, comprising:
   a cylindrical body portion;
   a tapered cylindrical body portion including a first end integrally formed with the cylindrical body portion;
   an inlet port connected to the cylindrical body portion and configured to receive a process gas to be removed from a process chamber body of a semiconductor processing tool by a main pumping line,
      wherein the semiconductor processing tool includes a chuck provided within the process chamber body and a chuck vacuum line connected to the chuck and configured to apply a vacuum to the chuck to retain a semiconductor device against the chuck,
      wherein the tapered cylindrical body portion is configured to prevent buildup of processing byproduct on interior walls of the main pumping line;
   an outlet port integrally formed with a second end of the tapered cylindrical body portion; and
   a pressure relief port connected to the cylindrical body portion,
      wherein a portion of the chuck vacuum line is provided through the pressure relief port and the outlet port.

2. The gas flow accelerator of claim 1, wherein the gas flow accelerator is provided within the main pumping line and around the portion of the chuck vacuum line.

3. The gas flow accelerator of claim 1, wherein the gas flow accelerator is configured to generate a rotational flow of the process gas to prevent the buildup of the processing byproduct on the interior walls of the main pumping line.

4. The gas flow accelerator of claim 1, wherein the gas flow accelerator is configured to increase a velocity of the process gas to prevent the buildup of the processing byproduct on the interior walls of the main pumping line.

5. The gas flow accelerator of claim 1, wherein the inlet port is connected at an angle to the cylindrical body portion to generate a rotational flow of the process gas within the gas flow accelerator.

6. The gas flow accelerator of claim 1, wherein the tapered cylindrical body portion is tapered at an angle to increase a velocity of the process gas within the gas flow accelerator.

7. The gas flow accelerator of claim 1, wherein an outlet of the chuck vacuum line is approximately adjacent to the outlet port of the gas flow accelerator to prevent processing byproduct from the chuck vacuum line from depositing on the interior walls of the main pumping line.

8. A gas flow accelerator, comprising:
   a cylindrical body portion;
   a tapered cylindrical body portion including a first end integrally formed with the cylindrical body portion,
      wherein the tapered cylindrical body portion is configured to prevent buildup of processing byproduct on interior walls of a main pumping line;
   an inlet port connected to the cylindrical body portion and configured to receive a gas from the main pumping line;
   an outlet port integrally formed with a second end of the tapered cylindrical body portion; and a pressure relief port connected to the cylindrical body portion,
    wherein the pressure relief port and the outlet port are configured to hold a portion of a chuck vacuum line.

9. The gas flow accelerator of claim 8, wherein the gas flow accelerator is configured to be provided within the main pumping line.

10. The gas flow accelerator of claim 8, wherein the gas flow accelerator is configured to generate a rotational flow of the gas to prevent the buildup of the processing byproduct on the interior walls of the main pumping line.

11. The gas flow accelerator of claim 8, wherein the gas flow accelerator is configured to increase a velocity of a gas flow to prevent the buildup of the processing byproduct on the interior walls of the main pumping line.

12. The gas flow accelerator of claim 8, wherein the inlet port comprises an angled cylindrical tube with an opening that oppositely faces a flow direction of the gas provided through main pumping line.

13. The gas flow accelerator of claim 8, wherein the tapered cylindrical body portion is tapered at an angle to increase a velocity of gas flow within the gas flow accelerator.

14. The gas flow accelerator of claim 8, wherein the pressure relief port is configured to enable the gas to exit the gas flow accelerator.

15. A gas flow accelerator, comprising:
a cylindrical body portion;
a tapered cylindrical body portion including a first end integrally formed with the cylindrical body portion;
an inlet port connected to the cylindrical body portion and configured to receive a gas from a main pumping line;
an outlet port integrally formed with a second end of the tapered cylindrical body portion; and
a pressure relief port connected to the cylindrical body portion,
    wherein the pressure relief port and the outlet port are configured to hold a portion of a chuck vacuum line.

16. The gas flow accelerator of claim 15, wherein the inlet port comprises an angled cylindrical tube.

17. The gas flow accelerator of claim 15, wherein the inlet port is connected to the cylindrical body portion at an angle to generate a rotational flow of the gas within the gas flow accelerator.

18. The gas flow accelerator of claim 15, wherein the inlet port is connected to a section of the cylindrical body portion that is away from a center section of the cylindrical body portion.

19. The gas flow accelerator of claim 15, wherein a length of a body comprising the cylindrical body portion and the tapered cylindrical body portion is greater than or equal to 100 millimeters.

20. The gas flow accelerator of claim 15, wherein a diameter of the cylindrical body portion is greater than or equal to 40 millimeters; and
    wherein a diameter of the outlet port is greater than or equal to 10 millimeters.

* * * * *